(12) United States Patent
Frederick (10) Patent No.: US 9,805,579 B2
(45) Date of Patent: *Oct. 31, 2017

(54) PROXIMITY DETECTION SYSTEM WITH CONCURRENT RF AND MAGNETIC FIELDS (71) Applicant: Strata Safety Products, LLC, Sandy Springs, GA (US)

(72) Inventor: Larry D. Frederick, Huntsville, AL (US)

(73) Assignee: Strata Safety Products, LLC, Sandy Springs, GA (US)

( * ) Notice: Subject to any disclaimer, the term of this patent is extended or adjusted under 35 U.S.C. 154(b) by 92 days.

This patent is subject to a terminal disclaimer.

(21) Appl. No.: 14/798,051

(22) Filed: Jul. 13, 2015

(65) Prior Publication Data
US 2015/0317897 A1    Nov. 5, 2015

Related U.S. Application Data (63) Continuation of application No. 13/568,674, filed on Aug. 7, 2012, now Pat. No. 9,081,046.

(60) Provisional application No. 61/521,125, filed on Aug. 8, 2011.

(51) Int. Cl.
*G01R 7/14*      (2006.01)
*G01R 33/02*     (2006.01)
*G08B 21/02*     (2006.01)
*G08G 1/16*      (2006.01)
*G08B 21/22*     (2006.01)

(52) U.S. Cl.
CPC ......... *G08B 21/22* (2013.01); *G01R 33/0206* (2013.01); *G08B 21/0275* (2013.01); *G08G 1/163* (2013.01)

(58) Field of Classification Search
CPC .............. G01R 33/0206; G01R 33/448; G01R 33/4616; G08B 21/22; G08B 21/0275; G08B 21/0213; G08B 21/18; G08G 1/163; G08G 1/166
See application file for complete search history.

(56) References Cited

U.S. PATENT DOCUMENTS

| | | |
|---|---|---|
| 4,628,311 A | 12/1986 | Milling |
| 5,734,685 A | 3/1998 | Bedell et al. |
| 5,806,017 A | 9/1998 | Hancock |
| 6,002,256 A | 12/1999 | Slade |
| 7,420,471 B2 | 9/2008 | Frederick et al. |
| 8,169,335 B2 | 5/2012 | Frederick et al. |
| 8,232,888 B2 | 7/2012 | Frederick et al. |
| 9,081,046 B2 * | 7/2015 | Frederick ........... G01R 33/0206 |
| 2003/0128783 A1 | 7/2003 | Richards et al. |
| 2004/0178944 A1 | 9/2004 | Richardson et al. |
| 2006/0116744 A1 | 6/2006 | Von Arx et al. |
| 2009/0109049 A1 | 4/2009 | Frederick et al. |
| 2009/0245475 A1 | 10/2009 | Otani et al. |

(Continued)

*Primary Examiner* — Minh N Tang
(74) *Attorney, Agent, or Firm* — Blank Rome LLP (57) ABSTRACT This disclosure provides a method and system for extending the capability of a proximity detection system that is based on use of low frequency magnetic fields, to avoid conflicts in crowded work sites. The improvement is attained by combining the advantages of these low frequency magnetic fields with the advantages of much higher frequency, radiated (RF) signals that are controlled to be produced at the same time, concurrent with each other, in a coordinated and/or synchronous manner.

19 Claims, 4 Drawing Sheets (56) References Cited

U.S. PATENT DOCUMENTS

2009/0322512 A1    12/2009   Frederick
2010/0271214 A1    10/2010   Frederick
2011/0121986 A1     5/2011   Kopp et al.

* cited by examiner

PROXIMITY DETECTION SYSTEM WITH CONCURRENT RF AND MAGNETIC FIELDS

CROSS-REFERENCE TO RELATED APPLICATIONS

This application is a continuation of U.S. patent application Ser. No. 13/568,674, filed on Aug. 8, 2012, now U.S. Pat. No. 9,081,046, which claims the benefit of U.S. provisional application 61/521,125, filed on Aug. 8, 2011, the subject matter of which are incorporated in their entirety by reference herein.

BACKGROUND

This disclosure relates generally to proximity detection systems at work sites, and in particular to an interactive magnetic marker field and proximity detection system. Mining is a very diverse industry, in many ways. The diversities include the differing product being mined, geologic formations from which the product is being extracted, locations throughout the world, strategies for mining, countless types of equipment used, mining above ground and underground, to mention a few examples. In most cases, equipment is being used to accomplish or to assist in the mining process including mining machines and vehicles. Such vehicles and mobile equipment may be used for above and/or below ground operations. Examples of the equipment include: road construction equipment such as trucks, road graders, rollers and pavers; surface mining equipment, such as for use with gravel and sand operations, front end loaders, trucks, dozers, conveyors and other items; underground mining equipment such as continuous miners, shuttle cars, conveyors, crushers, load-haul-dump vehicles, man-trips, tractors, and other items. The equipment also includes non-mining equipment, for example forklifts, cranes, and trucks used at warehouses and shipping ports.

Much too often, workers are injured while doing their jobs. As more equipment is used and as that equipment has become larger and more powerful. And as the operations have become more complex, many of the injuries and fatalities result from workers being struck or crushed by the mining machines or by collisions between vehicles.

Many methods have been devised to warn people against being struck, pinched, crushed or otherwise harmed by vehicles and mobile equipment. Unfortunately, the systems that have been devised to help protect people and property in these industrial operations, such as proximity detection and collision avoidance systems, have usually not been very effective. A new proximity detection system was developed and successfully demonstrated for use on continuous miners, as disclosed in U.S. Pat. No. 7,420,471 (the '471 patent), U.S. Pat. No. 8,169,335 (the '335 patent) and U.S. Pat. No. 8,232,888 (the '888 patent), and US patent publications 2009/0322512 (the '512 publication) and 2010/0271214 (the '214 publication), which patents and publications are herein referred to collectively as the "Frederick patents," the disclosures of which are incorporated herein by reference in their entireties. An objective of the '471 patent is to help prevent the crushing or pinning of personnel who are remotely controlling a continuous miner, and to help protect other personnel assisting in use of the continuous miners. The '471 patent also envisions to provide protection to personnel from other types of mobile equipment and machines. The system of the '471 patent employs a magnetic marker field and an active architecture that incorporates two-way communication between the worker and the machine the worker is near. Warnings are given to workers that are too close to the miner. Warnings are also provided to the operator of the machine. Provisions are made to immobilize the equipment until personnel are able to reach a safer position.

The magnetic fields used in the '471 patent system oscillate at low frequencies and can be effectively used to mark off warning zones, danger zones and silent zones. Although the maximum practical range of such low frequency (LF) magnetic fields may be as much as one hundred feet, in most applications that is more than is needed or desirable for most equipment. Typical very large off-highway haul trucks would probably be best served with a warning zone in the range of eighty feet and a danger zone in the range of thirty to forty feet. In some applications, such as remotely controlled continuous miners, it is necessary for the operator to remain within a range of five to ten feet much of the time in order to maintain good visual contact with the machine and the immediate surroundings. The zones are shaped to be longer in the direction of travel or movement but less in directions perpendicular to the direction of travel. In underground mines, the low frequency magnetic fields pass through earth formations unimpeded so that a worker that is around a corner, not in line of sight, or otherwise obstructed, will still be visible to the marker field. These magnetic fields do not radiate from antennas but simply expand and contract around the element that produces them, and are well suited for marking boundaries between silent zones and warning zones.

Proximity detection systems are beginning to be deployed in many types of mining operations around the world in an effort to avert mining accidents related to the use of machines and vehicles. As this technology advances, there is an increased need for higher performance from these systems.

Experience has confirmed that the most effective proximity detection systems utilize low frequency magnetic fields to establish markers or zones in which workers are sufficiently safely positioned with respect to a machine, and to establish separate zones that are not sufficiently safe. These systems are also effective for helping to avoid collisions between vehicles that are moving at slow speeds or are moving in a direction where visibility is limited. Statistics show that most accidents, including most fatalities, occur when the vehicles are moving at slow speed, have just started to move after having been stopped, or are moving in reverse. In some work site situations, multiple vehicles and machines might operating closely together and many personnel might be in close proximity to one or more of these machines or vehicles. The congested conditions increase the likelihood of accidents. Thus it is particularly desirable that the elements of proximity detection systems, whether located on the machines and/or vehicles or on the personnel, work properly in these congested conditions to provide the protection that is needed. Moreover, experience has shown that it is highly desirable that the systems not give false alarms because that gives rise to loss in confidence in the systems and leads to the systems not being used, not only when in congested areas, but at other times as well. The systems must be reliable at all times.

An example of a typical situation in an underground coal mine where congestion is experienced would be when shuttle cars are being loaded by a continuous miner or are waiting their turn to be loaded. A continuous miner will typically be sumping into the coal formation or its cutter will be shearing down into the coal, while a shuttle car is following and is being loaded. Occasionally, a first shuttle car does not get loaded in the usual amount of time so that other shuttle cars return from dumping their loads before the first car has been loaded. As a result, the first shuttle car is still being loaded while the others, typically two, are nearby, awaiting their turns. All three shuttle cars will be equipped with proximity systems, as well as the continuous miner, while there can also be one or more special proximity modules near that same location that provide protection from other dangers. Each of these machines will typically have an operator and there are often other mining personnel assisting the operation in some way and/or are observing or inspecting the operation. This is only one example of an almost endless range of possible situations where multiple proximity systems must work reliably at all times. It is in such situations where extra demands are placed upon the proximity systems to be able to protect all workers from all machines and vehicles without conflicting or confusing the personnel or impacting the proper operation of the equipment.

Currently, the proximity systems that are based on the preferred low frequency magnetic fields have limitations that will become significant with increasing demands upon the systems. Consider the situation described above where there are multiple machines positioned near each other and there are multiple workers around the machines. In this operational configuration, the safety zones for the multiple machines overlap. Personal alarm devices (PADs) being carried by workers, must reliably respond to each safety zone so that they are protected from being hit or crushed by any machine. The magnetic fields produced by the systems must not conflict or interact and produce zone shapes other than those intended. The magnitude of the challenge is easily seen when the number of generators is considered. In the example where there are three shuttle cars and one continuous miner, each having four generators, and each generator having to operate independently of other generators in order to produce shaped fields, there are a total of sixteen generators operating within the environment. If each is required to produce a zone four times per second then there must be fields produced sixty-four times per second. Although the generators on a machine can be coordinated by the central controller on that machine so as to not conflict with each other, the generators on the other machines will produce fields according to their own timing and might conflict (e.g., by producing their respective magnetic fields in a common area at the same time so that a PAD in the common area would experience a field strength resulting from the addition of the two fields). Currently, this challenge is being met by a variety of workarounds and techniques. Moreover, there are situations in surface mining in which many vehicles may be congregated in a small area and the zone sizes are much larger. The challenges of avoiding conflicts are growing as the technology is being advanced and utilized in more crowded work sites. Therefore, there is a need for a system and method to decrease the likelihood of conflicts between proximity detection systems.

SUMMARY

This disclosure provides a method and system for extending the capability of a proximity detection system that is based on use of low frequency magnetic fields, to avoid conflicts in crowded work sites. The improvement is attained by combining the advantages of these low frequency magnetic fields with the advantages of much higher frequency, radiated (RF) signals that are controlled to be produced at the same time, concurrent with each other, in a coordinated and/or synchronous manner.

An improvement in such capability can be made if the duration of the magnetic pulses can be reduced. Another improvement can be made if the magnetic pulses can be closer together. Coordinating the systems on the multiple machines to minimize the opportunity to conflict will make an even greater improvement. The current disclosure accomplishes all three of these improvements.

There are at least two methods of establishing silent zones by use of low frequency magnetic fields, which will be addressed. One approach is to produce short pulses of magnetic fields by the systems on the machines and to detect those fields by small personal alarm devices (PADs) carried by the workers. The fields may be produced by a single field generator or by multiple field generators. After detection of the fields indicates that a machine is dangerously close to the worker, the worker is warned, the operator of the machine is warned, and actions are taken to slow or stop the movement of the machine. The decisions as to whether the person is actually in a dangerous zone are made inside of the alarm device being carried by the person. This current disclosure is useful for this system configuration, referred to as the "ping-echo" system, described in detail in the '888 patent.

Another approach is to utilize multiple field generators on the machine to produce a series of magnetic field pulses such that the alarm devices being carried by any workers within range of the system each respond with its measurement of the field strengths from the multiple generators. The measured values of the field strengths from all the alarm devices are evaluated by the system on the machine. The location of each alarm device, and thus the person carrying the device, is calculated by triangulation or trilateration, techniques that have been used for decades for various purposes. If the position of the person is calculated to be in an unsafe position, actions are taken to warn the person or the machine operator or take action to slow or stop the machine, or a combination of these safety responses. The current disclosure as applied to this configuration is referred to as the "triangulation system."

The above and other advantages and features of the embodiments described herein will be more clearly understood from the following detailed description which is provided in connection with the accompanying drawings.

DETAILED DESCRIPTION OF PREFERRED EMBODIMENTS

The various embodiments described herein are particularly applicable to work sites that require personnel to be in close proximity to various hazardous elements, such as machines, mobile equipment, remotely controlled machines, and operated vehicles. Such work environments may include locations that are inherently dangerous and should be avoided or entered only with great caution. Examples of such work environments include surface mining, underground mining, sand and gravel operations, road construction, warehouses, shipping docks, coke plants, and others. Workers are sometimes struck, pinched, crushed or otherwise harmed while performing their jobs in such environments. Collisions between the various elements at the work sites need to be avoided also to avert property damage.

Proximity detection systems ("PDSs") are normally configured specifically for the type of machine or vehicle on which they are installed. For example, a typical shuttle car used in an underground coal mine will typically require a four generator ping-echo type system, utilizing two pairs of generators, each pair configured to produce shaped fields, in the form of a pulse (the "ping") of an oscillating magnetic field. The primary information from personal alarm devices ("PADs") or vehicle alarm devices ("VADs") to the system will be a short pulse of radio frequency ("RF") (the "echo"). In this configuration, explained in detail in the '888 patent, any number of PADs and VADs can be present with no conflict between them. The magnetic fields are pulsed, having a statistical timing element such that multiple systems can be operative within a typical work space without conflicts that would impair the effectiveness of the system.

Figure 1:
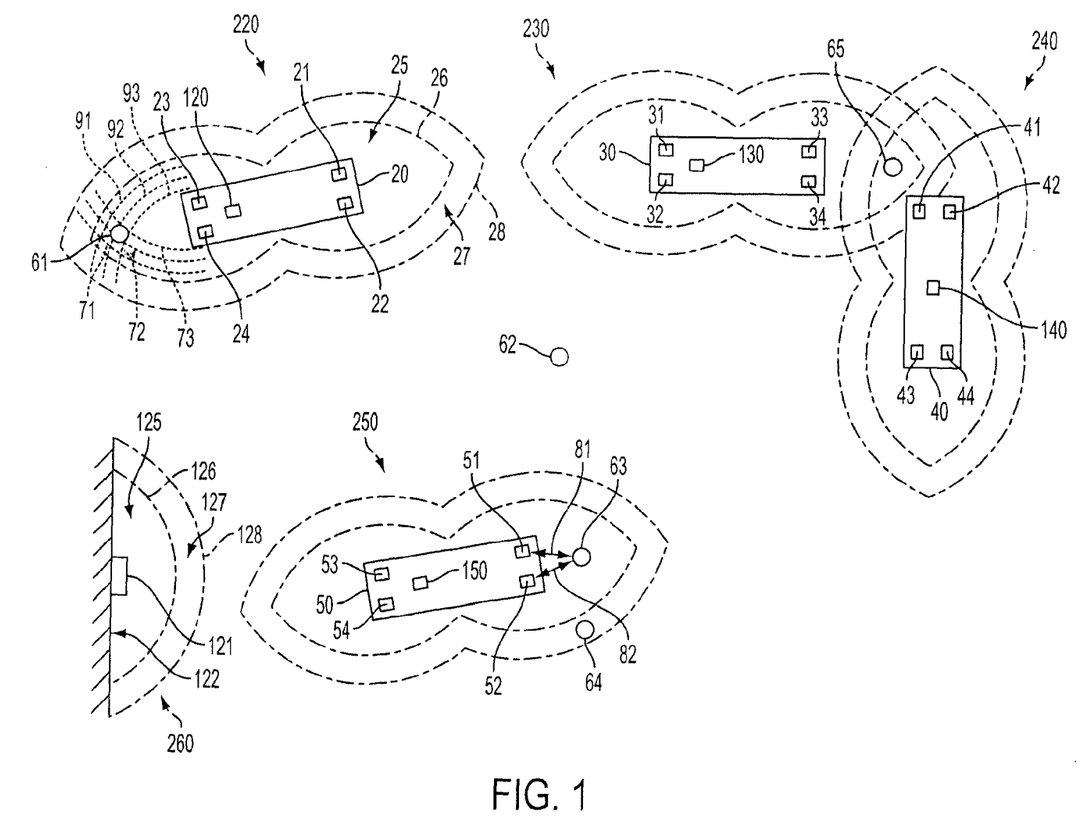
FIG. 1 is a schematic plan view of a work site having a proximity detection system according to preferred embodiments.
Figure 2:
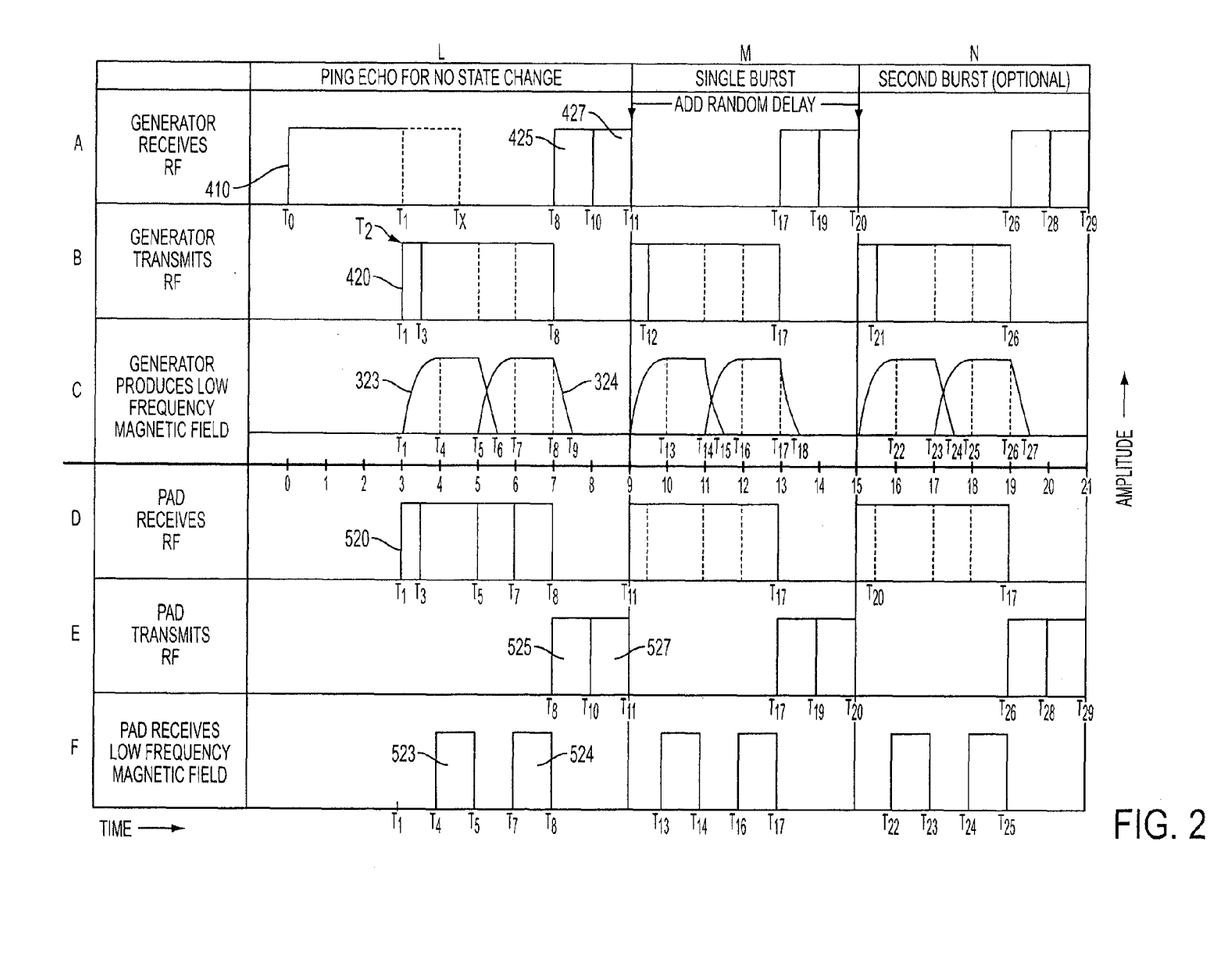
FIGS. 2 and 3 are timing diagrams of communications between proximity detection system components of FIG. 1.
Figure 3:
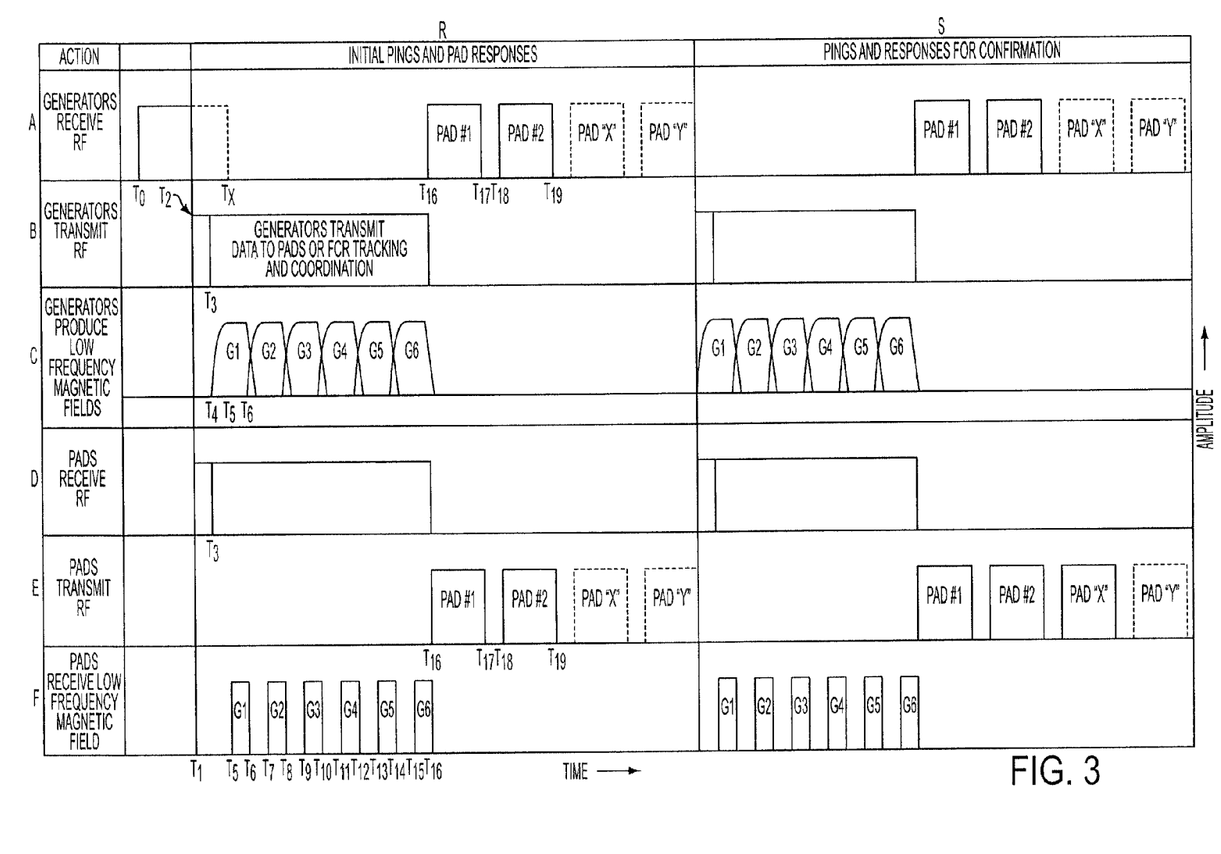

Referring now to FIG. 1, there is illustrated schematically a simplified example of a crowded work site where an embodiment is implemented. FIG. 2 and FIG. 3 show timing diagrams of communications between proximity detection system components of FIG. 1. Generally in FIG. 2 and FIG. 3, time progresses from left to right, and the time scale is marked in the axis running from left to right across the middle of FIG. 2. Each unit on that exemplary time scale is 0.001 sec. (one millisecond). The illustrated time scale is approximate and other timing may be used. FIG. 2. illustrates an example of the relative timing of the magnetic fields and RF signals of the embodiment of FIG. 1. FIG. 2 illustrates schematically six rows A, B, C, D, E, F of activity timing, all occurring during the same time period of the time scale. Progressing from top to bottom, the rows of activity timing are: (A) the generator receiving any RF signal; (B) the generator transmitting an RF signal; (C) the generator producing a low frequency magnetic field; (D) the PAD receiving any RF signal; (E) the PAD transmitting an RF signal; and (F) the PAD receiving a low frequency magnetic field. The top to bottom scale of FIG. 2 is amplitude, starting at zero near the base of each activity row A, B, C, D, E, F and increasing towards the top of the respective row.

FIG. 1 shows a proximity detection system 220 including four magnetic field generators 21, 22, 23, 24 that are operated by microcontroller 120 and mounted on a vehicle 20, for example, a shuttle car or continuous miner. Similar proximity detection systems 230, 240, 250 are also in the work site. The proximity detection system 230 includes four magnetic field generators 31, 32, 33, 34 that are operated by a microcontroller 130 and mounted on a vehicle 30. The proximity detection system 240 includes four magnetic field generators 41, 42, 43, 44 that are operated by a microcontroller 140 and mounted on a vehicle 40. The proximity detection system 250 includes four magnetic field generators 51, 52, 53, 54 that are operated by a microcontroller 150 and mounted on a vehicle 50. Also, a fixed proximity detection system 260 is located near a hazardous area 122 and includes a magnetic field generator 121 with an integral microcontroller. The proximity detection systems 230, 240, 250, 260 also include five personal alarm devices (PADs) 61, 62, 63, 64, 65 carried by five workers. Additionally, the vehicles 20, 30, 40, 50 may include VADs. The magnetic field generators and PADs are essential elements of a proximity detection system using a ping-echo system and are described in greater detail in the '888 patent.

The magnetic field generators generate magnetic fields that expand and collapse at a selected operating frequency. An operation frequency of approximately 73 kHz has been found to be a suitable choice, for example. Having knowledge of the teachings disclosed herein, persons knowledgeable in magnetics, tuned circuits and the intended applications can select the operating frequency and the circuit elements to fit the specific applications. For example, the operating frequency might be reduced to 25 kHz if the inductance to capacitance ratio and the voltage used to drive the circuit do not result in a rise time greater than desired for the system response that is required. Higher frequencies above about 100 kHz should be avoided in underground mining since they tend to propagate on cables and pipes, or via other metallic objects.

The PADs are capable of sensing and measuring the generated magnetic fields. A microcontroller in each PAD measures the strength of the ping signals and turns on an RF transmitter to send, through an antenna, a return echo signal to a receiver antenna in the magnetic field generators.

The magnetic field generators 21, 22, 23, 24 generate ping signal magnetic fields that expand and collapse at a selected operating frequency. The PADs 61, 62, 63, 64, 65 sense and measure the strength of the magnetic fields in which they are located. The size of the magnetic fields can be adjusted by increasing or decreasing the power of the magnetic field generators. In addition, the effective size of the magnetic fields can be adjusted by changing the magnetic field strength level at which the respective PAD determines it is within a magnetic field. For instance, by decreasing the magnetic field strength at which the PAD 64 determines it is within the magnetic field of the system 250, the effective size of the magnetic field increases. By increasing the magnetic field strength at which the PAD 64 determines it is within the magnetic field of the system 250 the effective size of the magnetic field decreases.

The PADs 61, 62, 63, 64, 65 send return echo signals, which are detected by the magnetic field generators. The magnetic field generator that detects the echo signal registers the presence of an echo and sends an appropriate response/information to its respective microcontroller 120, 130, 140, 150. In various embodiments, each magnetic field generator may include its own microcontroller or may share a common microcontroller. In use, the microcontroller determines whether the echo has been received in response to the magnetic field ping generated by a particular magnetic field generator. The microcontroller also determines in which magnetic field zones the echo-emitting PAD is located.

In the embodiment shown in FIG. 1, magnetic field zone 27 corresponds to a warning zone located around the equipment 20, and the magnetic field zone 25 corresponds to a danger zone located around the equipment 20. A boundary 26 is the location of a predetermined magnetic field strength, and defines the outer boundary of the danger zone 25 and the inner boundary of the warning zone 27. A boundary 28 is the location of another predetermined magnetic field strength, and defines the outer boundary of the warning zone 27. The magnetic field strength at the boundary 26 is higher than the magnetic field strength at the boundary 28. If the microcontroller 120 determines that a worker carrying a PAD has entered the magnetic field warning zone 27, audible and/or visible alarm signals are sent to an alarm system located near the vehicle operator and also to the affected worker. In various embodiments, the equipment 20 may be stopped, slowed, or its operation otherwise modified if a worker enters the magnetic field warning zone 27 or danger zone 25. The systems 230, 240, 250, 260 have similar safety zones. With respect to the system 260, the magnetic field zone 127 corresponds to a warning zone located around the hazardous area 122, and the magnetic field zone 125 corresponds to a danger zone located around the hazardous area 122. A boundary 126 is the location of a predetermined magnetic field strength, and defines the outer boundary of the danger zone 125 and the inner boundary of the warning zone 127. A boundary 128 is the location of another predetermined magnetic field strength, and defines the outer boundary of the warning zone 127. The magnetic field strength at the boundary 126 is higher than the magnetic field strength at the boundary 128. If the microcontroller of the magnetic field generator 121 determines that a worker carrying a PAD or vehicle carrying a VAD has entered the magnetic field warning zone 127, audible and/or visible alarm signals are sent to an alarm system located near the hazardous area and also to the affected worker or vehicle operator. In various embodiments, activity in the hazardous area 122 may be stopped, slowed, or its operation otherwise modified if a worker or vehicle enters the magnetic field warning zone 127 or the danger zone 125.

The following description is in greater detail for the system 220. However, the proximity detection systems 230, 240, 250, 260 operate similarly to the system 220 with respect to the concurrent generation of magnetic fields and RF signals. A central controller 120, shown in FIG. 1, controls the actions of the generators 21, 22, 23, 24 and makes decisions based upon responses from the alarm devices 61, 62, 63, 64, 65 carried by the workers and the VADs carried by other vehicles 30, 40, 50. The VADs may be incorporated into the generators or otherwise mounted on the vehicle. In addition, hazardous location generators, such as generator 121 may be placed near locations in the work site to be near, for example hazardous areas such as holes, ledges or fragile structures or materials, all generally represented in FIG. 1 as hazardous location 122. Before beginning a sequence to generate magnetic fields, this controller 120 activates the receiver portion of its transceiver and checks to determine if other devices are currently transmitting in the RF channel being used.

With reference to FIG. 2, this examination of the RF channel will have a duration from $T_0$ to $T_1$ that is longer than the duration from $T_8$ to $T_{11}$ of the gaps into which PADs 61, 62, 63, 64, 65 must send their echoes. If there is another system 230, 240, 250, 260 already transmitting, this system 220 will listen for relevant information being transmitted via RF. After the channel is clear, this system 220 will wait for a period of time from $T_1$ to $T_X$, the duration preferably being varied based on a random time generator, after which it will listen again, effectively restarting the sequence of FIG. 2 at T0. If the RF channel is not in use during the time from T0 to T1, the controller turns on the RF transmitter in all four generators 21, 22, 23, 24 at T1. The presence of the RF signals from these transmitters is received by the three-axis sensing circuits within those PADs or VADs that are within range (the PAD 61 is shown to be in range in FIG. 1) and the start of the ping-echo sequence is initiated. So long as any of these transmitters are on, any other system 230, 240, 250, 260 in the vicinity that might be preparing to start a ping sequence will wait as described above until the RF channel is clear. If data/information is to be transmitted, all but one transmitter in the system will be turned off and the data will be sent through the one transmitter that is left active.

A few microseconds later at $T_3$, the length of delay from $T_1$ to $T_3$ depending upon the type of transmitter being used, the RF transmitters will have reached a stable condition so that data can be transmitted. The information that is sent at this time from $T_3$ to $T_8$ depends upon the architecture of the system, which may be adjusted to be optimized for the environment and operation in which it is being used. Included may be information about the configuration of system that has initiated the ping sequence. As example system configuration variables, the system might have a single generator, multiple generators operating synchronously, pairs of generators being used to produce shaped fields, and/or multiple generators being used to triangulate position of PADs and VADs. The PADs and VADs can be programmed to adjust the way that they interpret the pings and how they respond based on the system configuration they detect. Much care must be taken in adding features that rely on real-time transmitted data/information because the reliability of the system could be reduced by corrupted information. There are reliability advantages in using a simple ping-echo approach, as described in the Frederick patents, with typical noise rejection algorithms and verification protocols applied. If a piece of transmitted information is to be used in the decision making processes, either in the system or the PADs, it must be verified before being used, making sure that the information is not being altered/corrupted by noise, defective elements in the system, or conflicts.

The controller 120 will, at the designated time $T_1$, some micro-seconds or possible a few milliseconds after determining that no other systems are operating, begin sending pulses to the first magnetic field generator 23 to pump up the resonant circuit that will produce the magnetic field 323 through the ferrites, depicted at row C of FIG. 2. After another period of time from $T_1$ to $T_4$, the magnetic field 323 will have effectively reached its full strength. At $T_5$, the controller 120 will discontinue sending resonance driving pulses to the first generator 23 so that its oscillating field 323 begins to dissipate. With reference to FIG. 9 and associated text of the '471 patent, advantageously, the field-effect transistor (FET) in the generator circuit may be opened at T5 so that the field will collapse more quickly.

In the illustrated embodiment, the generators 23, 24 are operated together as a pair. The next ping 324 can be started at $T_5$ immediately after the time for the previous ping 323 has ended. At $T_5$, the controller 120 will immediately start pulsing the second generator 24 so that the oscillating field 324 produced by the ferrite will begin rising. After another period of time from $T_5$ to $T_7$, the magnetic field 324 will have effectively reached its full strength. At $T_8$, the controller 120 will discontinue sending resonance driving pulses to the generator 24 so that its oscillating field 324 begins to dissipate. The PADs and VADs will not attempt to measure the strength of the field 324 from the second generator 24 until $T_7$ after enough time has passed at $T_6$ for the field 323 from the first generator 23 has dissipated and the field 324 from the next generator 24 has reached maximum or near maximum strength at $T_7$.

The PADs and VADs that happen to be within the safety zones for the machine 20 on which this PDS system 220 is installed, namely PAD 61 in FIG. 1, will have sensed the magnetic field in three axes and taken measurements and registered or stored data or achieved a state indicative thereof and/or of a warning zone, danger zone or other zone. The PADs and VADs will be programmed to know exactly when the ping has ended at $T_8$, since its functions are timed from the initial RF trigger pulse starting at $T_1$. So, PAD 61 is programmed to short out its sensing circuits at $T_8$, collapsing the oscillation that was initiated by the incoming pings. By collapsing the field from the generator and also collapsing the fields in the sensing circuits in the PADs and VADs, the time for completing the ping-echo process can be decreased and the next ping can be initiated much more quickly.

At $T_8$, the system will turn off the transmitters in the generator and activate the generator's RF receiver in order to receive any echoes from any PADs or VADs that may have entered the defined safety zones. Meanwhile, the PADs will read their sensing circuits at the same time that the system has turned off the transmitters in its generators and has turned on its receivers. If any PADs have registered that they have entered any safety zones, such as the warning zone 27 or the danger zone 25, the PADs will turn on their transmitters for a few micro-seconds (up to five hundred micro-seconds in some instances depending upon the RF devices being utilized) to echo back into the time slot established for the zone responses. For the PAD 61 of the illustrated embodiment, it would have sensed both fields 323 and 324 (row F of FIG. 2) and registered that it was in the danger zone 25. Accordingly, the PAD 61 would generate an RF signal 525 between times $T_8$ and $T_{10}$ (row E of FIG. 2) and the generator 23, 24 or the controller 120 would receive the signal 525 at the time 425 between times $T_8$ and $T_{10}$ (row A of FIG. 2). If, however, the PAD 61 had registered that it was in the warning zone 27, the PAD 61 would generate an RF signal 527 between times $T_{10}$ and $T_{11}$ (row E of FIG. 2) and the generator 23, 24 or the controller 120 would receive the signal 527 at the time 427 between times $T_{10}$ and $T_{11}$ (row A of FIG. 2).

The above steps, along with other considerations that are described elsewhere in this specification, allow compressing the length of the ping sequence by up to approximately a factor of three or more over that which would have been possible without the concurrent transmission of RF and low frequency pulses (pings).

If other machines 30, 40, 50 or fixed hazards 122 are in the work space, each having its own PDS system 230, 240, 250, 260, steps must be taken to allow all the generators for these PDS systems to operate without interference. The various considerations related to simultaneous operation of these kinds of systems in close proximity has been thoroughly presented in the Frederick patents referenced earlier. However, as the number of generators in a work space increases, the difficulty in avoiding conflicts increases. In order to help maintain a fast response by the systems in a crowded worksite when many generators are present, the transmission of trigger pulses and/or data concurrent with the generation of oscillating magnetic fields, as described herein, can be used.

Embodiment 1

Ping-echo with concurrent RF and LF pulses. Expanding on the foregoing discussion, the details of the timing and concurrent actions can be visualized as explained below:

$T_0$: Prior to starting a ping-echo sequence, a proximity system 220 on a machine 20 will activate the RF receivers in each generator 21, 22, 23, 24 and/or controller 120, and listen during a listening time period from $T_0$ to $T_1$ at listening window 410 to determine if another proximity system, such as the PDSs 230, 240, 250, 260, in its range is carrying out a ping-echo sequence. The listening period initial time length, the amount of time from the initial listening start time, $T_0$ to the initial listening stop time, $T_1$, required to make sure that the RF channel is clear should be as short as possible but must be long enough to catch the RF transmissions from other systems. This duration will vary depending upon the types of RF elements selected and the timing that has been chosen for a particular system design. The duration of this listening period 410 is depicted in FIG. 2 as ending at $T_1$. If an RF receiver in any of the field generators 21, 22, 23, 24, this being four for a system on a typical shuttle car 20, this detection will result in a signal being sent to the controller 120. In turn, the controller 120 will delay the start of a ping-echo sequence until $T_X$ to extend the listening time period. The additional listening time length, the amount of delay between $T_1$ and $T_X$, is based on a randomly generated number. By making the delay random, the likelihood of continuing conflicts between the PDSs 220, 230, 240, 250, 260 is decreased. If the system does not detect an RF signal within its listening window 410, it will begin a ping-echo sequence and that time, even if there have been one or more delay, shall be referred to as $T_1$ for purposes of this description.

$T_1$: The system will turn on the RF transmitters in all generators 21, 22, 23, 24, this being four for the example of a shuttle car 20. An RF transmitter in the UHF range or higher, will normally begin transmitting within a few micro-seconds. Other proximity systems 230, 240, 250, 260 in the work area will be barred from starting their own respective ping-echo sequence since they will detect the RF signal during their listening window similar to listening window 410 of row A. It is not necessary for the RF transmitter to reach full power or to be stabilized for transmitting data in order to perform this function. It is only necessary for a carrier signal to be present that other systems 230, 240, 250, 260 can detect. Likewise, the PADs and VADs in the area can recognize the RF signal and perform calculations to more precisely establish the point in time $T_1$ that the RF signal was initiated, which will be a short time before the time $T_2$ that the RF signal can be detected.

At the same instant at $T_1$ that the RF transmitter is turned on, as discussed above, the controller 120 will command the first magnetic field generator 23 to start the first magnetic pulse. A magnetic field 323 is produced by energizing an LC circuit that is tuned to the frequency at which the field is to oscillate. Low frequencies in the range of 73 kHz have been shown to have advantages over other frequencies but other frequencies can be used. Generating the magnetic field is accomplished by pulsing the LC circuit at the resonant frequency. The oscillation will grow larger with each pulse until the losses in the circuit, equal the energy being put into it. A typical profile of the rise in the field 323 strength is shown in FIG. 2. Details that describe this process for a typical field generator are given in the '471 patent, the '888 patent and the '335 patent.

$T_2$: $T_2$ is the time when the RF signal 420 reaches an effective output after being initiated at $T_1$. The time between $T_1$ and $T_2$ is relatively small, and in the timing diagrams in FIGS. 2 and 3 appears almost instantaneous. However, $T_2$ indicates that there is some amount of time required for that to occur.

$T_3$: Many factors can affect the length of time that an RF receiver and an associated micro-controller may need to evaluate an incoming RF signal 420 to determine with sufficient certainty that the signal is not noise but is a signal being intentionally produced by a proximity system. Therefore, the time between $T_1$ and $T_3$ must be selected based on the parameters of the PDS elements being used and the algorithms selected for this purpose. A person skilled in the art can make a judgment as to the optimum period of time that will allow the system to function as quickly as desired but also to be precise in its decision-making.

Once this point in time $T_3$ has been reached, data transmission may be made by the system 220 to the PADs and VADs or to receivers within the mining area, for a variety of purposes. Importantly, with the synchronized or scheduled actions by the system elements, data can be sent concurrent with the generation of magnetic fields. One obvious purpose is to send tracking information to the communication system so that personnel on the surface can know where the miners are relative to the machines or to other receivers in the mine. Also, the PADs and VADs can be commanded by the controller to transmit data, including tracking data, during these times.

$T_4$: Eventually, the low frequency pulse 323 reaches a magnitude sufficiently near its maximum so that its strength may be accurately measured by PADs and VADs in the area for purposes of determining whether they are positioned within safety zones 25 or 27. Then a period of time, defined by the difference between $T_4$ and $T_5$ is needed for the PADs and VADs to make the measurement many times and to average the results to minimize the effect of noise.

$T_5$: The amount of time, perhaps a millisecond, that is needed to allow an accurate measurement is programmed into the controller 120 which establishes the duration of the magnetic field pulse. Each PAD and VAD is also programmed for this time and each one is programmed to start this period of time for taking the measurement, all referenced from $T_1$. In other words, the controller 120 starts the RF signal 420 at the same time that the low frequency pulse 323 is started. All PADs and VADs are programmed to begin measuring the strength of the magnetic field 323 that it is detecting, referenced to $T_1$. Since the rise time of the RF signal 420 allows precisely defining the start of the magnetic field pulse and, therefore, the PADs and VADs know the exact point in time at which the measurements should be started and ended, all calculated from $T_1$.

Once the period of time programmed for the PADs and VADs to make measurements has expired at $T_5$, the controller 120 takes action to collapse the oscillating fields 323 as quickly as possible. The architecture of the described embodiment includes shaped fields produced by the generators. Reasons for using shaped fields and the methods and operation of the system required to produce shaped fields are described in the '888 patent. With the shaped field architecture, field generators are operated as pairs, each being operated at a different time. Therefore, as shown in FIG. 2, a second pulse 324 follows immediately after the first pulse 323. The first pulse 323 will be produce by one generator 23 and the second pulse will be made by its mate 24, typically on the opposite side of the machine 20. Reasons and methods for producing fields in such ways are fully explained in earlier disclosures, such as the '888 patent and the '214 publication. The described embodiment improves the ping-echo process by producing and detecting RF radiation concurrently with the production and measurement of low frequency magnetic fields. One improvement is to compress the amount of time required to produce and to respond to the ping-echo pulses. Another improvement is to decrease the likelihood of conflicts between many ping-echo systems being used, in a crowded work area.

Note in FIG. 2 that the second pulse 324 is started at the same time $T_5$ that the first pulse 323 is being ended. As a result, both pulses 323, 324 will be present at the same time between $T_5$ and $T_6$. The pulse 323 from the first generator 23 will be decaying between $T_5$ and $T_6$ while the pulse 324 from the second generator 24 will be increasing. Multiple fields from these generators 23, 24 will interact between $T_5$ and $T_6$ to produce a composite field, which will change shape as the fields 323, 324 from the generators 23, 24 change magnitude and as the phase angle between the fields change. If measurements were to be made during this time between $T_5$ and $T_6$, erroneous values would be obtained and the results would be meaningless. However, since the point in time $T_1$ of the sharp leading edge of the RF signal 420 is known by the controller 120 and the low frequency pulses 323, 324 are referenced to this point $T_1$, the controller 120 knows when PADs and VADs should be making their measurement and when they will be sending their responses. PADs and VADs will only make measurements when there is no conflict between pulses 323, 324 from the pair of generators 23, 24. Also, the responses 525, 527 by the PADs and VADs are made to exactly fall within the time windows 425, 427 when the controller 120 will be looking for responses. Referring to FIG. 2, it can be seen that the PAD 61 will send a pulse 525 of RF back to the controller 120 after a first predetermined time delay, during the time from $T_8$ to $T_{10}$ if it is determined to be in a danger zone 25, but will send a pulse 527 of RF back to the controller 120 after a second predetermined time delay, during the time between $T_{10}$ and $T_{11}$ if it is in a warning zone 27. Note that there may be additional zones defined if needed but experience has shown that two safety zones are sufficient for most applications.

In most applications, it is critical that false warnings not be produced. One way to greatly increase the reliability of the system is to repeat the process and verify that the same decisions are made. They can even be repeated two additional times. Both of these options are depicted in FIG. 2 at columns M and N.

Additional details on how this is best accomplished is given in the '888 patent. For example, note that a random delay (shorter than the period from $T_0$ to $T_1$ is added prior to beginning the first and second bursts of columns M and N of FIG. 2. This delay would be added to the timeline. Also note that the timing of the repeat bursts of columns M and N are similar to the timing of the initial ping-echo of column L after $T_1$.

The system 220 of vehicle 20 will also perform the foregoing ping-echo sequence for the pair of generators 21 and 22. Although the illustrated embodiment is for a shuttle car 20 using shaped fields, a single generator can be used without shaped fields by having the single generator produce both pulses.

Moreover, there may be multiple PADs and VADs in the safety zones that are responding simultaneously within the time windows 425, 427. For the ping-echo process of the described Embodiment #1, it is not necessary to discriminate between or identify the PADs and VADs, because the initial system response is the same whether there is just a single PAD or VAD or multiple PADs and/or VADs in a given safety zone. However, in the embodiments described below, discrimination between and identification of each PAD and VAD may be accomplished.

Embodiment 2

Concurrent RF and magnetic fields to locate personnel. Once the ping-echo sequence described above has resulted in a system 220 determining that there has been a change in State to a warning state (i.e., a PAD or VAD in a warning zone) or a danger state (i.e., a PAD or VAD in a danger zone) by one or more PADs and/or VADs, such as PAD 61, concurrent RF signals with the magnetic field pulsing can be useful in determining the location of those PADs and/or VADs.

As described above, using a simple echo response, in the form of an RF carrier pulse, timed to fall within a receiving window of the proximity system, is a very reliable means of establishing a warning state or a danger state. An advantage is that there cannot be a conflict between PAD or VAD responses. In fact, as the number of responses from multiple units increases, it is more certain that a system will recognize that a unit has moved into a warning or danger zone. Once a change in state has been determined, the system can proceed to take the programmed action of warning the operator, slowing the machine, or stopping movement of part or all of the machine, or any other action that has been provided to improve safety. Likewise, the PADs or VADs that have moved into a safety zone can take action to warn personnel and to communicate messages as planned.

It is useful, in some situations, for the systems to do more than just to warn or act to improve safety. For example, tracking of personnel and recording of safety events is also valuable to the operation and can be provided by allowing the systems and PADs and VADs to transmit data at times and in ways that will not degrade system performance. As explained in Embodiment #1, these functions may be enhanced by transmitting RF signals concurrent with magnetic field generation. In the case of very large vehicles, such as trucks that are larger than the average residential house, the operator would like to not only be warned but also to know the location of PAD or VAD that is the source of the warning. Although these very large trucks are very tall and the operator is in a cab, generally near the top, visibility is severely limited, which is one reason there are many serious accidents with these vehicles. Cameras and mirrors help but have been found to be limited in their ability to alert an operator that small vehicles, personnel, or even other large vehicles are nearby. Therefore, sometimes these very large vehicles run over or into the small vehicles, personnel, or other large vehicles. The system described in Embodiment #1 is effective in alerting the operator that a collision is possible and also to alert pedestrian workers and other vehicles. In addition, the operator would like to know quickly where the pedestrian or other vehicle is positioned to allow more effective avoidance of collision. Application of the described Embodiment #2 provides this information, while maintaining the accuracy and reliability of a magnetically-based ping-echo proximity system.

Once the proximity system has determined that a PAD or VAD of a person or vehicle or machine is within a safety zone, the operator can be informed of the location of the PAD or VAD by a location process to now be explained. The systems have been configured as explained in Embodiment #1 to use an RF signal from one system to notify other systems that might be in the area that a ping-echo sequence has started. This same RF signal is used to send instructions, after the ping-echo sequence has been completed, and as assumed in this case, has established that a PAD or VAD is in a safety zone. The system logs the presence of any PADs or VADs in its range, as part of its usual operation, and can be used to give specific commands to specific PADs or VADs, if required. Once it is established that a PAD or VAD has entered a safety zone, the system can send an enquiry to all PADs and VADs, requesting confirmation of their respective identification (I.D.). Since the system and the PADs and VADs are responding according to a time schedule based on the leading edge of the RF pulse sent at the start of the ping-echo sequence, events can be precisely timed. Therefore, the PAD or VAD that just changed state can respond with a pulse in a receiving window established in the system for this purpose, followed by its I.D. In turn, the system can command one generator to begin pulsing, either increasing or decreasing the strength of the field and looking for an echo. The strength of the magnetic field can be adjusted by use of a potentiometer inside the controller at the time that the system is set up and/or calibrated. It is also possible to make small adjustments to the field by use of a movable shunt on the generator. At the strength setting at which echoes start or stop being returned, the PAD or VAD making the responses is at the edge of the field. Knowing the PAD and VAD field strength threshold for making echo responses, the system and can calculate (based on prior calibration data or information on the spatial profile of generated magnetic field strength at that strength setting) the distance of the PAD from the generator. Immediately, the system can do the same with another generator.

For example, with reference to FIG. 1, generator 23 in location mode generates successive pulsing magnetic fields with portions of threshold strengths boundaries represented by the dotted lines 71, 72, 73, with line 71 representing a stronger field because the threshold strength is located farther from the generator 23. When the generator 23 strength setting results in generated fields having threshold strength boundaries 71, 72 the PAD 61 senses that the threshold strength has been met (boundary 72) or exceeded (boundary 71) and sends an echo response. More broadly stated, when the generator 23 strength setting results in generated fields having threshold strength boundaries at boundary 72 or farther from the generator 23, the PAD 61 senses that the threshold strength has been met (at boundary 72) or exceeded (farther from the generator 23) and sends an echo response. Thus, the controller 120 can determine that the PAD 61 is at boundary 72.

Similarly, generator 24 generates successive pulsing magnetic fields with portions of threshold strengths boundaries represented by the dotted lines 91, 92, 93, with line 91 representing a stronger field because the threshold strength is located farther from the generator 24. When the generator 24 strength setting results in generated fields having threshold strength boundaries 91, 92 the PAD 61 senses that the threshold strength has been met (boundary 92) or exceeded (boundary 71) and sends an echo response. Thus, the controller 120 can determine that the PAD 61 is at boundary 92. The controller 120 calculates the distances between generators 23, 24 and the PAD 61. Those distances are not marked on FIG. 1 to preserve the clarity of the figure, but analogous distances are shown, namely distances 81 and 82 between PAD 63 and generators 51, 52 of system 250. Advantageously, this process for determining the distance between the PAD (or VAD) and the generator does not require the transmission of any data between the PAD and the generator. Thus, the required signal bandwidth is reduced, and there is lower likelihood of miscommunication, such as due to noise or signal corruption.

The same process can be carried out with generators 21 and 22. The computer can then use the determined distances from some or all of the generators to make calculations, for example using trilateration, to determine the spatial location of the PAD 61, and can then put a marker on a computer screen, showing that PAD 61 location relative to an outline or plan-level picture of the vehicle 20. By use of the precision timing that derives from use of the leading edge of the RF signal produce at the beginning of the ping-echo sequence, and by sending RF carrier pulses from the PADs or VADs at the same time that magnetic pulses are being produced, the sequence required to locate a PAD or VAD around the vehicle can be accomplished within a few milliseconds. As discussed above, in the location process of Embodiment #2 the output of the generator is repeatedly increasing and decreasing in magnitude, converging to the value at the edge of the defined safety zone. Concurrently, the PAD or VAD that has been commanded by the system to report back would be sending responses concurrent with the changes in value of the magnetic field. There will some hysteresis in the magnetic pulses, due to the time required for the LC circuit to fully respond to the change in the duration of the pulses sent to the LC circuit. However, this is easily accommodated in the software by someone skilled in the art. The key is that the timing can be precise and the change can be made quickly and the responses from the PADs and/or VADs can be occurring at the same time that the magnetic field is continuing to be changed in size.

It should be recognized that the most critical decision by a proximity system is whether someone or something has moved into a zone that is potentially unsafe or is a present danger. Being able to then identify the approximate location of that person or thing does not have to be accomplished with the same degree of speed or precision as is needed for establishing that a potentially unsafe condition exists. Therefore, the function of identifying the location should be done only after decisions about incursions into the safety zones have been accomplished and all associated actions have been taken.

Embodiment 3

Triangulation using concurrent RF and LF pulses. In general, triangulation and trilateration techniques (collectively referred to herein as triangulation) used in proximity detection systems involve sending signals from multiple sources on a vehicle or proximate a hazardous area to an object or worker that is to be located. The component of the system located on the object (or worker), the "object device" or PAD or VAD, evaluates these signals to calculate its distance from each source, and then calculates its position. Or, the object device responds by sending information to the sources or to another receiver where the calculations are performed. Triangulation techniques require that the object device communicate precise information about its location. That information must be provided relative to each of the multiple known source locations. There are at least four source locations for three dimensional positioning, but PDS systems currently using triangulation use more than four sources on each machine. If there are multiple PADs or VADs in the range of the PDS system or systems, then each one must respond with precise information about its relationship to all the required points. Given multiple generators on multiple machines and given multiple PADs and VADs, the bandwidth requirements to accommodate all the signals, and the responses to those signals, may be substantially greater than a low frequency (LF) magnetic system or even a medium frequency magnetic system can provide. Integrating RF with the LF frequency pulsing as described herein can be very beneficial to improving the effective bandwidth of the system and for reducing conflicts between fields and/or signals. Thus, PDSs with location capability may be operated with more PADs and VADs in a crowded worksite.

A PDS system having four or more generators would be arranged so that all the generators on the system would be sequenced as close together as possible, using the techniques described in Embodiment #1. This might require 36 milliseconds without the assistance of concurrent RF signals to trigger the pulsing events. However, if the pulse durations have been reduced by incorporating RF signals, this may be reduced to 12 milliseconds, or possibly less. Once the pulses have been measured by the PADs and/or VADs in the range of the magnetic field, each one reports the distance it is from each of the generators. If there are, for example, ten PADs and VADs within range, a time slot is allocated for each one to transmit its measured distance from each of the four generators, for a total of forty time slots corresponding to the train of RF data/information transmission pulses. In addition, the systems may use multiple RF channels, if available. By using a precise time marker to begin and end the pulse train at exact times, and to coordinate transmission by all the PADs and VADs during their respective time slot, these forty transmissions can be made within a short overall time, in sequence, and without conflict. Before starting a ping sequence, each of the systems in the work area will check to verify that the channel is available and withhold its pulsing until any currently operating system has completed receiving its data from the PADs and VADs. Once a precise trigger mechanism is in place that prevents systems from generating magnetic fields at the same time, and prevents the PADs and VADs from transmitting at the same time, additional features can be provided by having transceivers that can operate on more than one frequency (i.e., using multiple RF channels).

After all of the data has been transmitted, the operation can be repeated for verification, if needed for system accuracy. If the geometry of the application is more complex, such as having moving parts that must be considered, it may be desirable to increase the number of generators used, perhaps to six to eight generators. However, as the number of generators increases, the issues related to available bandwidth have greater significance.

Referring to FIG. 3, an example of a timing and scheduling of the system of Embodiment #3 using six generators, is illustrated.

$T_0$: As depicted at row A of FIG. 3, each system will listen, in the manner described above with respect to Embodiment #1, before initiating a triangulation sequence. The duration of this listening phase will vary, depending upon parameters within the system elements, but will be sufficient to ensure that another system in the work site is no already operating.

$T_1$: After the listening period has been completed and no RF signals of other systems have been detected, beginning at $T_1$ the RF transmitters in one or more of the generators will transmit a carrier signal, depicted at row B of FIG. 3, to alert other systems that a triangulation sequence is starting so that the other systems will not attempt to produce conflicting fields. Once a sufficiently long carrier has been sent so that the signal stabilizes, the RF transmitters may begin sending data or may send commands or other information, or may perform a combination of these actions—all while magnetic fields are being sent and received by PADs or VADs, as depicted at rows C and F of FIG. 3. Short periods of the generators receiving data sent from the PADs and VADs can also be scheduled and timed with small-enough duration gaps between signals so that the presence of the RF field will continue to be detected by other systems which will withhold the commencement of the generation of other fields that may conflict.

As discussed with respect to Embodiment #1, the leading edge occurring at $T_1$ of the RF carrier provides a precise reference for all elements of the system to schedule its actions and/or responses to actions by other elements.

$T_2$: $T_2$ represents the end of the rise of the leading edge of the RF carrier signal.

$T_3$: At $T_3$, the, initial carrier signal has stabilized and the transmission of the carrier and data signal may commence, as desired.

$T_4$: Once an RF carrier has been sent to establish a reference point $T_1$, and to inhibit fields from being produced by other systems, the controller sends pulses to the first generator to begin production of the first magnetic field.

$T_5$: After a delay from $T_4$, at $T_5$ the magnetic field will have reached its maximum or will be nearly at its maximum so that the PADs and VADs in the area can read the strength of the first generator at their position relative to that field source. Each PAD and VAD will store those readings until the scheduled time for them to report their results.

$T_6$: At $T_6$, the first magnetic field pulse is terminated and action is taken to collapse the magnetic field as quickly as possible. With the precise timing reference $T_1$, the second field pulse can be started at the same time $T_6$ that the first field is being collapsed. Between $T_6$ and the time that the first field has effectively dissipated (which is at or before the time $T_7$, the time that the second field has reached its effective field strength) the two fields from the two generators may conflict. So the PADs and VADs do not listen for, or merely ignore, the fields between $T_6$ and $T_7$, so that any conflicts that occur at this time will be ignored.

$T_7, T_9, T_{11}, T_{13}, T_{15}$: At times $T_7, T_9, T_{11}, T_{13}, T_{15}$, the pulses started by the other generators have reached their respective effective full strength as scheduled and the fields produced by those generators are measured by each PAD and/or VAD in the area.

$T_8, T_{10}, T_{12}, T_{14}, T_{16}$: At times $T_8, T_{10}, T_{12}, T_{14}, T_{16}$, the respective pulses are ended and the fields are collapsed. Also, at T16, the first PAD or VAD may begin transmitting the results of the measurements made for each pulse from each source. Each of the other PADs and VADs are allotted a unique window (as depicted at row E) during which to transmit the results it recorded and the generator receives the results during this window as depicted at row A. As shown in FIG. 3, the window for PAD #1 is between $T_{16}$ and $T_{17}$, and the window for PAD #1 is between $T_{18}$ and $T_{19}$. The windows for the other PADs follow in their assigned order. The receivers in one or more of the generators receives the data and forwards it to the processor within the controller. Using the data, which indicates measured field strength, and using field strength profiles, the controller calculates the distance from each PAD to each of the generators it sensed, and can triangulate the position of the PAD relative to the machine, as well as the position of the PADs and VADs relative to any zone configuration that has been stored within the controller. From those calculations, decisions are made as to whether there is a PAD or VAD in any safety zone that should result in a warning or should result in taking actions such as slowing or stopping part or all of the machine or vehicle, as discussed above and in the Frederick patents.

There is no limit to the number of PADs or VADs that are used except that the system response will begin to slow as the numbers increase. Also, it can be seen from FIG. 3 that in order to help ensure that there are no errors in the decisions made as during the initial process at column R, the results can be retransmitted once as depicted in column S, or more (by repeating column S), and the results compared. These confirmations may particularly desirable if there is a change in the safety status of a PAD or VAD from the previous triangulation sequence, which would have been only a fraction of a second earlier. Other logical approaches may also be taken to reduce erroneous decisions, such as requiring the responses from a predetermined number of repeat sequences to be the same (within a set tolerance) before a decision to change status is made, without repeating any specific reading. This repetition slows the process somewhat but may not be a significant constraint to the system if the parameters of all of its elements allow a sufficiently fast response.

When multiple PADs or VADs are entering and leaving the work area, there must be a method for entering them into the process so that they can schedule their actions and responses to fit within the overall timing of the system. One technique for doing this is for the controller to assign timing slots to each PAD or VAD, based on their unique I.D. If one of the PADs or VADs leaves the area, the unit having the latest timing slot can be moved forward to fill the slot of the one that left. Since the controller can schedule transmissions concurrent with magnetic pulse generation, the incoming unit can be given its timing slot information. On the other hand, if a new unit comes into the area, it can be assigned a time slot that follows the latest one previously in the system. To accomplish these steps, the controller has a listening window (not shown) at row A at the end of the last scheduled PAD reporting window and the newly arriving unit reports in at that listening window. Other techniques used for synchronizing multiple communicating devices can be employed since the ability to send RF signals concurrently with the magnetic pulses makes possible the precise timing of multiple systems and multiple receiving units.

It should be pointed out that some of the actions described herein as coming from the controller can be accomplished within the generator. For example, it is possible for the controller to not send pulses to the generators but only send a start signal so that the generator may produce its own pulses and schedule the pulse and collapse of its own field.

Figure 4:
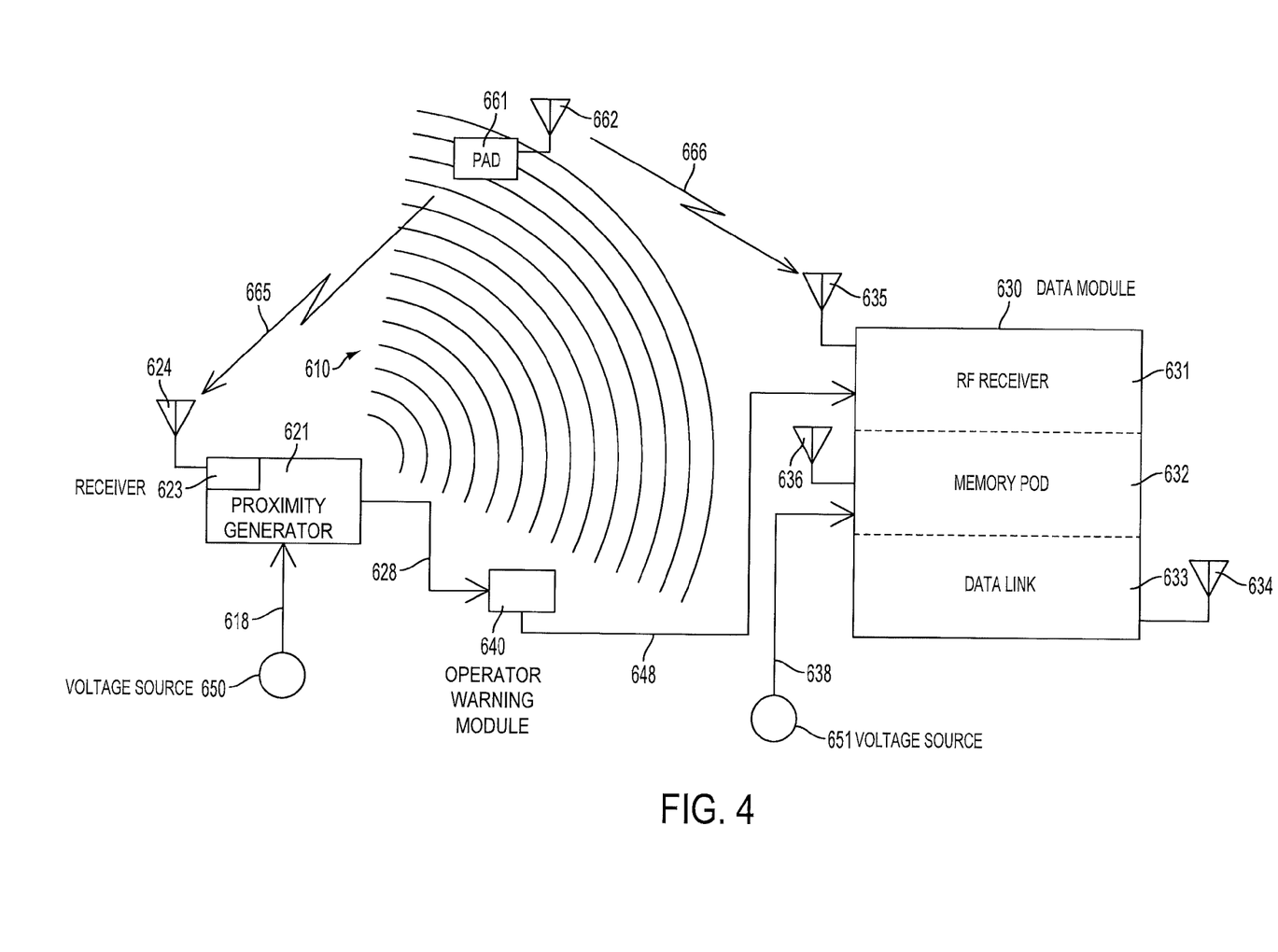
FIG. 4 is a schematic diagram of hardware components of an embodiment of the system of FIG. 1.

Refer now to FIG. 4, there being shown schematically various communications between components of a PDS according to a preferred embodiment. A proximity generator 621, powered by a voltage source 650 via a conductor 618, generates a LF magnetic field 610. A PAD 661 detects the field 610 and transmits RF signals 665 and 666 via its antenna 662. The RF signal 665 is received by a receiver 623 of the generator 621 via its antenna 624. Upon initiating a ping of field 610, the generator 621 sends a pulse signal to an operator warning module 640 via a connector 628. This signal marks the beginning of the process, $T_1$, as described above. The signal marking $T_1$ is further transmitted via a connector 648 to a data module 630.

The signal marking $T_1$ may be used to synchronize the various components to help in discriminating between and identifying PADs and VADs, such as PAD 661 as illustrated in FIG. 4. The signal may be send by RF as discussed above, although it may be advantageous to send the signal via a connector where practical, such as for magnetic field generators (MFGs) mounted on a vehicle with a warning module and/or data module. Because the signal arrives by the connector, the warning module and/or data module of the vehicle can distinguish the MFGs on the vehicle from other MFGs that may be on other vehicles and hazardous locations in the complex work environment. Thus, the use of the connector allows further synchronization between the devices mounted on a common machine or vehicle.

The data module 630 includes an RF receiver 631, a memory pod 632 and a data link 633. The data module is powered by a voltage source 651 via a connector 638. The RF signal 665 is received by the receiver 631 of the generator 621 via its antenna 635. The memory pod 632 accumulates data received by the data module 630, processes the data and communicates by a connector (not shown) with the machine or vehicle on which it is mounted, for example sending slow down or stop instructions to the vehicle when a PAD is sensed in the danger zone around the vehicle. The memory pod may also collect information from devices using a Bluetooth antenna 636.

The data link 633 includes a transceiver and communicates via its antenna 634 with central equipment such as a base station for the complex work environment. The data link 633 gathers various data information, for example the speed or other states of the machine, whether a PAD is in a warning or danger zone and other information. The data link 633 may transmit the data to a receiving system at the base station that collects and correlates data from multiple machines and personal alarm devices and vehicle alarm devices. The transceiver and antenna 634 use RF at a frequency sufficiently different from the RF communications between the PAD and the MFG and data module via antennas 624, 662 and 635 in order to decrease the likelihood of interference among RF signals.

The above description and drawings are only illustrative of preferred embodiments, and are not intended to be limiting. Any subject matter or modification thereof which comes within the spirit and scope of the following claims is to be considered part of the present inventions.

What is claimed as new and desired to be protected by Letters Patent of the United States is:

1. A proximity detection system for complex work environments for detecting the presence of a worker or operator or vehicle carrying an alarm device in a potentially hazardous environment, the proximity detection system comprising:
    a plurality of hazardous locations;
    each of the hazardous locations having at least one magnetic field generator;
    each of the at least one magnetic field generators adapted to generate ping pulses of a magnetic field, the magnetic field oscillating at low frequency during each ping pulse, the ping pulses having predetermined pulse durations;
    each of the at least one magnetic field generators adapted to generate radio frequency electromagnetic signals during the predetermined pulse durations;
    each of the at least one magnetic field generators adapted to sense radio frequency electromagnetic signals during a listening time period, the listening time period having a predetermined initial time length, the initial time length starting at an initial listening start time and ending at an initial listening stop time;
    each of the at least one magnetic field generators adapted to, upon sensing a radio frequency electromagnetic signals during said listening time period, continue to sense radio frequency electromagnetic signals during an additional listening time length, to extend the listening time period;
    each of the at least one magnetic field generators adapted to, upon not sensing a radio frequency electromagnetic signal during said listening time period, start generating the magnetic field ping pulses and the radio frequency electromagnetic signals;
    a plurality of alarm devices located on the persons of a plurality of workers and/or operators and/or vehicles, each device being adapted to sense the strength of the ping pulse magnetic field in which the device is located and to generate an echo response signal after a predetermined echo time delay, wherein the length of the predetermined echo time delay is based on the sensed strength of the ping pulse magnetic field, wherein a first length of the predetermined echo time delay corresponds to a first zone of the magnetic field and a second length of the predetermined echo time delay corresponds to a second zone of the magnetic field; and
    each of the at least one magnetic field generators being adapted to receive the echo response signals, and to, in response to receiving the echo response signal during a window of time corresponding to the predetermined echo time delay, identify that the device is located in the first or second zone of the magnetic field, each zone being smaller than the magnetic field.

2. A proximity detection system as in claim 1 wherein there are four generators.

3. A proximity detection system as in claim 1 wherein there are a plurality of generators and a first generator and a second generator generate respective first and second magnetic fields during respective first and second time periods, and wherein said first and second time periods do not overlap with one another for at least a portion of their respective durations, and wherein said first and second magnetic fields partially overlap with one another,
    and wherein the length of the predetermined echo time delay of the alarm devices is based on the sensed strength of the ping pulse magnetic fields, wherein a first length of the predetermined echo time delay corresponds to an overlap zone within in both the first and second magnetic fields, and a second length of the predetermined echo time delay corresponds to a non-overlap zone within only one of the first and second magnetic fields.

4. A proximity detection system as in claim 1 wherein there are a plurality of generators, each generator adapted to, in location mode, vary the magnet field strength setting until the alarm device is positioned at a predetermined threshold field strength, and to calculate the distance between each generator and the alarm device based on the settings, and to calculate the position of the alarm device using the calculated distances.

5. A proximity detection system as in claim 1 wherein there are a plurality of generators, and the alarm device sends a signal to a controller indicative of the measured field strength from each generator, and wherein the controller is adapted to calculate the distance between each generator and the alarm device based on magnetic field strength profiles, and to calculate the position of the alarm device, using the calculated distances.

6. The proximity detection system of claim 1, wherein said proximity detection system is located at a work site selected from the group consisting of a surface mining site, an underground mining site, a sand and gravel operation, a road construction site, a warehouse, a shipping dock, and a coke plant.

7. The proximity detection system of claim 1, wherein said plurality of hazardous locations are selected from the group consisting of trucks, road graders, rollers, pavers, front end loaders, dozers, conveyors, continuous miners, shuttle cars, crushers, load-haul-dump vehicles, man-trips, tractors, fork lifts, cranes, holes, ledges, and fragile structures or materials.

8. The proximity detection system of claim 1, wherein each device has unique echo time delays.

9. A proximity detection system as in claim 1, wherein the additional listening time length is determined based on a random time generator.

10. A proximity detection system as in claim 1, wherein the listening time period is longer than the window of time corresponding to the predetermined echo time delay.

11. A proximity detection system as in claim 1, wherein at least one of the hazardous locations is mobile.

12. A proximity detection system as in claim 1, wherein at least one of the hazardous locations is at a fixed location.

13. A proximity detection system as in claim 1, wherein the window of time corresponding to the predetermined echo time delay is different than the listening time period.

14. A proximity detection system as in claim 1, wherein the windows of time corresponding to the predetermined echo time delay does not overlap with the listening time period.

15. A method for providing proximity detection for complex work environments for detecting the presence of a worker or operator or vehicle carrying an alarm device in a potentially hazardous environment, comprising the steps of:
- generating a ping pulses of a magnetic field, the magnetic field oscillating at low frequency during each ping pulse, the ping pulses having predetermined pulse durations;
- generating radio frequency electromagnetic signals during the predetermined pulse durations;
- sensing radio frequency electromagnetic signals during a listening time period, the listening time period having a predetermined initial time length, the initial time length starting at an initial listening start time and ending at an initial listening stop time;
- upon sensing a radio frequency electromagnetic signals during said listening time period, continue to sense radio frequency electromagnetic signals during an additional listening time length, to extend the listening time period;
- upon not sensing a radio frequency electromagnetic signal during said listening time period, to start generating the magnetic field ping pulses and the radio frequency electromagnetic signals;
- sensing the strength of the ping pulse magnetic field in which the alarm device is located and generating an echo response signal after a predetermined echo time delay, wherein the length of the predetermined echo time delay is based on the sensed strength of the ping pulse magnetic field, wherein a first length of the predetermined echo time delay corresponds to a first zone of the magnetic field and a second length of the predetermined echo time delay corresponds to a second zone of the magnetic field; and
- receiving the echo response signals, and to, in response to receiving the echo response signal during a window of time corresponding to the predetermined echo time delay, identifying that the device is located in the first or second zone of the magnetic field, each zone being smaller than the magnetic field.

16. A proximity detection system as in claim 15, wherein the additional listening time length is determined based on a random time generator.

17. A proximity detection system as in claim 15, wherein the listening time period is longer than the window of time corresponding to the predetermined echo time delay.

18. A method for synchronizing events in proximity detection systems, comprising the steps of:
- using a magnetic field generator on or at a hazardous location, generating ping pulses of a magnetic field, the magnetic field oscillating at low frequency during each ping pulse;
- transmitting an electric signal from the generator to a data module coincident with the leading edge of the initial ping pulse;
- using the electrical signal in correlating other data received by the data module related to personal alarm devices, vehicle alarm devices and magnetic field generators of the proximity detection system, and in synchronizing actions of such devices.

19. A method as in claim 18, further comprising the steps of: transmitting data from the data module to a receiving system that collects and correlates data from multiple machines and personal alarm devices and vehicle alarm devices.

* * * * *